(12) United States Patent
Petta et al.

(10) Patent No.: US 11,910,728 B2
(45) Date of Patent: Feb. 20, 2024

(54) FLOPPING-MODE ELECTRIC DIPOLE SPIN RESONANCE

(71) Applicant: The Trustees of Princeton University, Princeton, NJ (US)

(72) Inventors: Jason Petta, Princeton, NJ (US); Stefan Putz, Princeton, NJ (US); Xiao Mi, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 27 days.

(21) Appl. No.: 16/937,330

(22) Filed: Jul. 23, 2020

(65) Prior Publication Data

US 2021/0028344 A1 Jan. 28, 2021

Related U.S. Application Data

(60) Provisional application No. 62/877,681, filed on Jul. 23, 2019.

(51) Int. Cl.
| | | |
|---|---|---|
| *H01L 39/22* | (2006.01) | |
| *H10N 60/10* | (2023.01) | |
| *G06N 10/00* | (2022.01) | |

(52) U.S. Cl.
CPC .............. *H10N 60/11* (2023.02); *G06N 10/00* (2019.01)

(58) Field of Classification Search
CPC .... H01L 39/221; H01L 29/7613; G06N 10/00
See application file for complete search history.

(56) References Cited

U.S. PATENT DOCUMENTS

| 10,192,976 B2 | 1/2019 | Petta et al. | |
|---|---|---|---|
| 11,364,663 B2 * | 6/2022 | Obata | C08K 3/36 |

(Continued)

FOREIGN PATENT DOCUMENTS

| WO | WO-2018063170 A1 * | 4/2018 | ............. B82Y 10/00 |
|---|---|---|---|
| WO | WO-2018125062 A1 * | 7/2018 | ............. B82Y 10/00 |

OTHER PUBLICATIONS

Mi et al., "Strong coupling of a single electron in silicon to a microwave photon" Science, vol. 355, 2017, pp. 156-158; Retrieved from http://science.sciencemag.org/ on Jan. 13, 2017.

(Continued)

*Primary Examiner* — Jarrett J Stark
(74) *Attorney, Agent, or Firm* — BakerHostetler

(57) ABSTRACT

Methods, devices, and systems are described for performing quantum operations. An example device at least one magnetic field source configured to supply an inhomogeneous magnetic field, at least one semiconducting layer, and one or more conducting layers configured to: define at least two quantum states in the at least one semiconducting layer, and cause, based on an oscillating electrical signal supplied by the one or more conducting layers, an electron to move back and forth between the at least two quantum states in the presence of the inhomogeneous magnetic field. The movement of the electron between the at least two quantum states may generate an oscillating magnetic field to drive a quantum transition between a spin-up state and spin-down state of the electron thereby implementing a qubit gate on a spin state of the electron.

15 Claims, 8 Drawing Sheets
(7 of 8 Drawing Sheet(s) Filed in Color)

(56) References Cited

U.S. PATENT DOCUMENTS

| | | | | |
|---|---|---|---|---|
| 2007/0059877 | A1* | 3/2007 | Koo | H01L 29/772 |
| | | | | 257/E29.039 |
| 2017/0317203 | A1* | 11/2017 | Petta | H01L 31/035209 |
| 2019/0392352 | A1* | 12/2019 | Lampert | G06F 1/206 |
| 2020/0052101 | A1* | 2/2020 | Petta | H01L 29/7613 |
| 2020/0403137 | A1* | 12/2020 | Lampert | H01L 39/025 |
| 2021/0066570 | A1* | 3/2021 | Luethi | H01L 39/025 |
| 2021/0367065 | A1* | 11/2021 | Petta | H01L 29/165 |

OTHER PUBLICATIONS

Mi et al., "Circuit quantum electrodynamics architecture for gate-defined quantum dots in silicon" Applied Physics Letters, vol. 110, No. 043502, 2017, 4 pages.

Croot et al., "Flopping-mode electric dipole spin resonance" Physical Review Research, vol. 2, No. 012006(R), Jan. 8, 2020, 6 pages.

* cited by examiner

FLOPPING-MODE ELECTRIC DIPOLE SPIN RESONANCE

CROSS-REFERENCE TO RELATED APPLICATIONS

This application is related to U.S. Patent Application No. 62/877,681 filed Jul. 23, 2019, which is hereby incorporated by reference for any and all purposes.

GOVERNMENT RIGHTS

This invention was made with government support under Grant No. W911NF-15-1-0149 awarded by the U.S. Army/Army Research Office and Grant No. H98230-15-R-0453 awarded by the U.S. Department of Defense. The government has certain rights in the invention.

BACKGROUND

Traditional approaches to controlling single spins in quantum dots require the generation of large electromagnetic fields to drive many Rabi oscillations within the spin coherence time. However, these traditional approaches generate too much heat when scaled to multiple qubit systems. Thus, there is a need for more sophisticated quantum devices where low power control of the spin state is feasible.

SUMMARY

Methods, devices, and systems are described for performing quantum operations. An example device may comprise at least one magnetic field source configured to supply an inhomogeneous magnetic field. The device may comprise at least one semiconducting layer. The device may comprise one or more conducting layers configured to define at least two quantum states in the at least one semiconducting layer, and cause, based on an oscillating electrical signal supplied by the one or more conducting layers, an electron to move back and forth between the at least two quantum states in the presence of the inhomogeneous magnetic field. The movement of the electron between the at least two quantum states may generate an oscillating magnetic field to drive a quantum transition between a spin-up state and spin-down state of the electron thereby implementing a qubit gate on a spin state of the electron.

An example method may comprise defining, using one or more conducting layers, at least two quantum states in at least one semiconducting layer. The at least two quantum states may be within an inhomogeneous magnetic field. The method may comprise causing, based on an oscillating electrical signal supplied by the one or more conducting layers, an electron to move back and forth between the at least two quantum states in the presence of the inhomogeneous magnetic field. The movement of the electron between the at least two quantum states may generate an oscillating magnetic field to drive a quantum transition between a spin-up state and spin-down state of the electron thereby implementing a qubit gate on a spin state of the electron.

An example system may comprise a signal generator configured to generate a microwave frequency electrical signal and a structure disposed in a cavity. The structure may comprise at least one magnetic field source configured to supply an inhomogeneous magnetic field, at least one semiconducting layer, and one or more conducting layers. The one or more conducting layers may be configured to: define at least two quantum states in the at least one semiconducting layer, and cause, based on a oscillating electrical signal generated by the signal generator and supplied by the one or more conducting layers, an electron to move back and forth between the at least two quantum states in the presence of the inhomogeneous magnetic field. The movement of the electron between the at least two quantum states may generate an oscillating magnetic field to drive a quantum transition between a spin-up state and spin-down state of the electron thereby implementing a qubit gate on a spin state of the electron.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

Additional advantages will be set forth in part in the description which follows or may be learned by practice. It is to be understood that both the foregoing general description and the following detailed description are exemplary and explanatory only and are not restrictive.

BRIEF DESCRIPTION OF THE DRAWINGS

The file of this patent or application contains at least one drawing/photograph executed in color. Copies of this patent or patent application publication with color drawing(s)/photograph(s) will be provided by the Office upon request and payment of the necessary fee.

The accompanying drawings, which are incorporated in and constitute a part of this specification, illustrate embodiments and together with the description, serve to explain the principles of the methods and systems.

DETAILED DESCRIPTION OF ILLUSTRATIVE EMBODIMENTS

Figure 1:
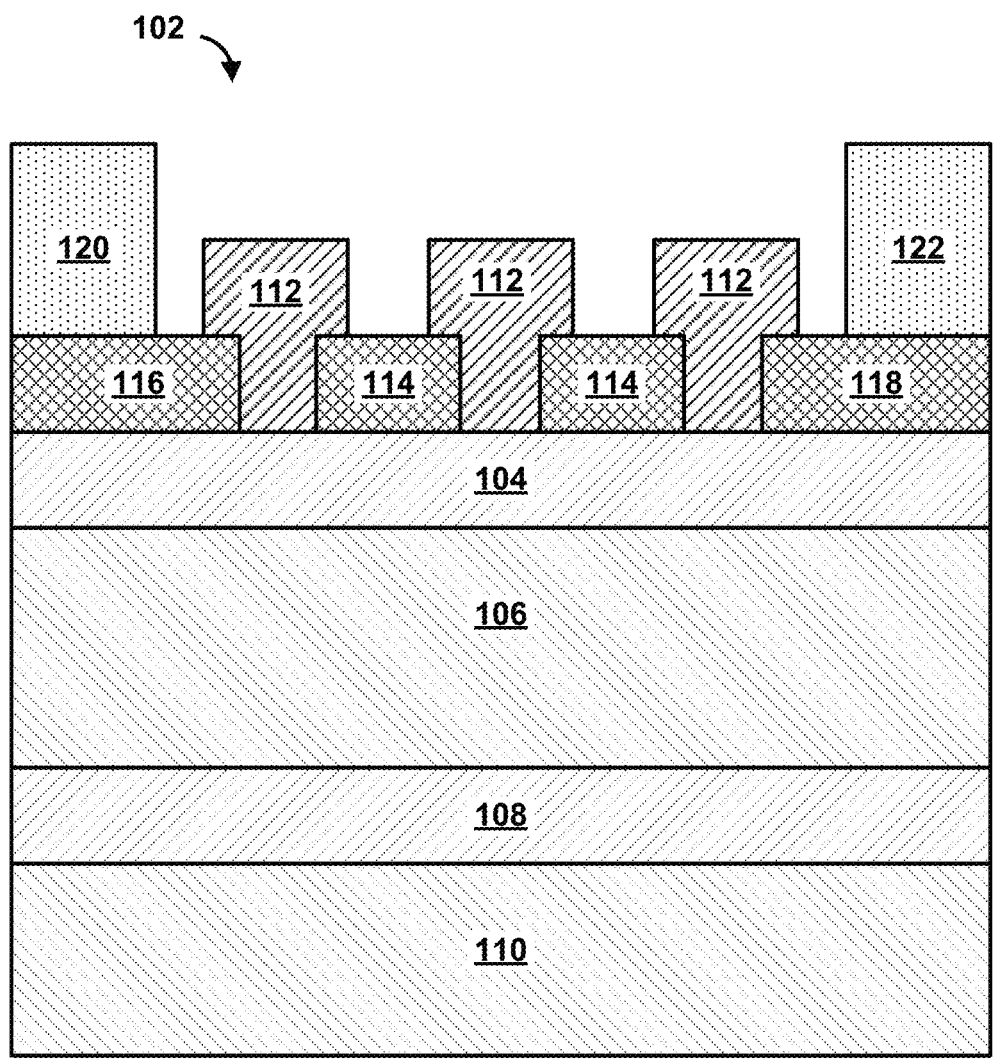
FIG. 1 shows a diagram of an example structure or device in accordance with the present disclosure.

Disclosed herein are techniques for driving quantum transitions between spin states (e.g., spin-up state and spin-down state) of an electron thereby implementing a qubit gate on a spin state of the electron. The disclosed process, which may be referred to herein as "flopping-mode electric dipole spin resonance," allows fast single spin-qubit operations to be electrically driven at low powers. Single qubit operations are required in quantum computing and the disclosed mechanism may be applied to implement spin-based quantum computing. As detailed herein, one can utilize this process in a complete spin-based quantum computing device architecture.

Single spin rotations in semiconductor quantum dots may be performed using the disclosed flopping-mode electric dipole spin resonance process. The disclosed approach may be employed, inter alia, in a device architecture that combines the electron spin resonance process with one or more qubit gates based on exchange coupling or cavity coupling, and interactions with ancilla quantum dots for microwave readout of the spin state.

Single spin rotations may generally be implemented using a process called electron spin resonance. In conventional electron spin resonance, the spin may be controlled using a microwave frequency (e.g., 10-40 GHz) oscillating magnetic field. The oscillating magnetic field is difficult to localize on a small scale and is created using milli-amp currents (e.g., current is in reference to a quantum dot, and the current runs through a wire close to the dot), which is difficult to scale to a large number of qubits in a cryogenic environment due to the high power dissipated by the current. The disclosed process for driving single spin rotations is based on shifting the position of an electron in a magnetic field gradient, which leads to an effective oscillating magnetic field (e.g., and lower power dissipation).

Previous approaches that induced magnetic oscillations involved using single quantum dots, where the electron is displaced by a small amount (e.g., about 1 pm) and high electric fields are required to achieve such a displacement. The disclosed process involves electrically driven spin resonance in a double quantum dot. In a double quantum dot, the electron can be displaced by a much larger distance, leading to larger effective oscillating magnetic fields, and much faster spin rotation rates. The faster spin rotation rates allow the spin to be driven at low microwave powers, which is beneficial in a cryogenic environment. Additionally, disclosed is a quantum computing architecture that combines the electron spin resonance process with two-qubit gates based on exchange coupling or cavity coupling, and interactions with ancilla quantum dots for microwave readout of the spin state.

An example device may be made on a Si/SiGe semiconductor heterostructure that confines electrons in a two-dimensional plane, technically referred to as a two-dimensional electron gas. Three overlapping layers of aluminum electrodes may be biased to confine a single electron within a double quantum dot (DQD). Single spin electron spin resonance is efficiently driven by moving the electron from the left to the right side (e.g., and vice versa) of the double quantum dot at high frequencies in a magnetic field gradient. The displacement of the electron over a relatively large distance (set by the quantum dot separation), or "flopping" from one dot to the other, leads to spin rotation "Rabi frequencies" that are orders of magnitude larger than obtained using other methods at the same driving power. These single spin rotations comprise single qubit gate operations that may be required in any quantum computing architecture.

A quantum computing device architecture disclosed herein takes advantage of this efficient single qubit rotation process. Quantum dots may be coupled using the exchange interaction or by coupling to a cavity field, thereby implementing the two-qubit gate set. Single spin rotations (the single qubit gates) may be efficiently driven using flopping-mode electric dipole spin resonance. The spin state of an electron in the computer is read-out by coupling the electron to an ancilla quantum dot, which enables dispersive readout of the electronic spin state.

All quantum computing implementations are subject to decoherence processes, which lead to errors. The spin degree of freedom of the electron may be used in the disclosed architecture, since the spin is weakly coupled to the environment and is capable of supporting long coherence times.

The disclosed device has been made and tested experimentally. It was shown that flopping-mode electric dipole spin resonance is capable of driving fast single spin rotations using microwave powers that are much smaller than those required in other physical implementations.

The disclosed approach may be used, inter alia, to rapidly and efficiently control spin qubits. A realistic quantum computing architecture may be based on the flopping-mode electric dipole spin resonance process. Example advantages are speed, efficiency, and low power consumption.

FIG. 1 shows a diagram of an example structure 102 (e.g., or device), such as a quantum structure. The quantum structure may be configured to store quantum state information. The structure 102 may be configured to define at least two first quantum states. The at least two first quantum states may comprise, have, and/or be indicative of spin states (e.g., electron spin states). The structure 102 may define the at least two first quantum states based on one or more potential wells (e.g., generated using gates to define electric fields). The at least two first quantum states may comprise a first quantum dot and a second quantum dot. The second quantum dot may be adjacent to the first quantum dot. The second quantum dot may be separated from the first quantum dot by a distance. The distance may be close enough to allow an electron to tunnel between the first quantum dot and the second quantum dot. The distance may be less than about 50 nm. The at least two first quantum states may comprise a gate defined silicon double quantum dot. The at least two quantum states may be biased to achieve zero detuning (e.g., or near zero detuning due to fabrication variability) such that the at least two quantum states are on resonance. The at least two quantum states may biased to within about 10 micro-electron volts of zero detuning such that the at least two quantum states are on resonance. The at least two quantum states may be biased to minimize a power (e.g., power P required to drive coherent spin-state rotations) and maximize the Q factor.

The at least two first quantum states may be defined in a first semiconducting layer. The structure 102 may be configured to confine an electron in or more of the at least two quantum states. The structure 102 may comprise at least one magnetic field source, such as a first magnetic field source 120 and the second magnetic field source 122. The first magnetic field source 120 and/or the second magnetic field source 122 may be configured to supply a first inhomogeneous magnetic field to the electron. An external magnetic field may also be applied such that at least two spin states of the electron occur at different energy levels.

The at least one magnetic field source may comprise at least one micro-magnet disposed in a material stack comprising the first semiconducting layer. The at least one first magnetic field source may comprise a first micro-magnet (e.g., the first magnetic field source 120) and a second micro-magnet (e.g., the second magnetic field source 122) separated from the first micro-magnet. The at least one magnetic field source may be tilted such that a long axis of the at least one magnetic field source is angled relative to an axis between the at least two quantum states of the structure 102. The at least one magnetic field source may comprise a current carrying wire configured to generate the inhomogeneous magnetic field. The at least one magnetic field source may comprise an electrically tunable material, a multiferroic material, an electrically tunable multiferroic material, a combination thereof, and/or the like. The at least one magnetic field source may generate a magnetic field of about 1 Tesla/micron magnetic field gradient. The at least one magnetic field source may cause a magnetic field gradient that is sufficiently large to cause a change in the magnetic field as the electron moves back and forth between the at least two quantum states in a range of about 1 mT to about 10 mT, about 1 mT to about 15 mT, about 1 mT to about 20 mT, about 1 mT to about 500 mT, about 1 mT to about 1000 mT, or a combination thereof.

The structure 102 may comprise one or more semiconducting layers, such as first semiconducting layer 104, a second semiconducting layer 106, a third semiconducting layer 108, a fourth semiconducting layer 110, or a combination thereof. The one or more semiconducting layers may comprise one or more of silicon, germanium, or silicon germanium. The one or more semiconducting layers may comprise an isotopically enriched material. The one or more semiconducting layers may be isotopically enriched to sustain (e.g., increase a duration of) quantum coherence. The isotopically enriched material may comprise isotopically enriched silicon. The isotopically enriched silicon may comprise nuclear spin zero silicon 28 isotope. The first semiconducting layer 104 and the third semiconducting layer 108 may comprise the same material, such as silicon or isotopically enriched silicon. The second semiconducting layer 106 and the fourth semiconducting layer 110 may comprise the same material, such as a silicon germanium.

The structure 102 may comprise one or more conducting layers. The one or more conducting layers may comprise overlapping layers of metallic gate electrodes. The metallic gate electrodes may comprise a source accumulation gate, a drain accumulation gate, two plunger gates, two screening gates, and three tunnel barrier gates. The one or more conducting layers may comprise a first conducting layer comprising one or more barrier gates 112. The one or more barrier gates 112 may be configured to define at least two quantum states (e.g., by defining barriers between the at least two quantum states). The one or more barrier gates may be configured to define one or more quantum potential wells, such as a double quantum dot (e.g., gate defined double quantum dot), triple quantum dot (e.g., with the addition of another plunger gate), and/or the like. The one or more barrier gates 112 may be configured tune a wave function overlap between the at least two quantum states.

Figure 2A:
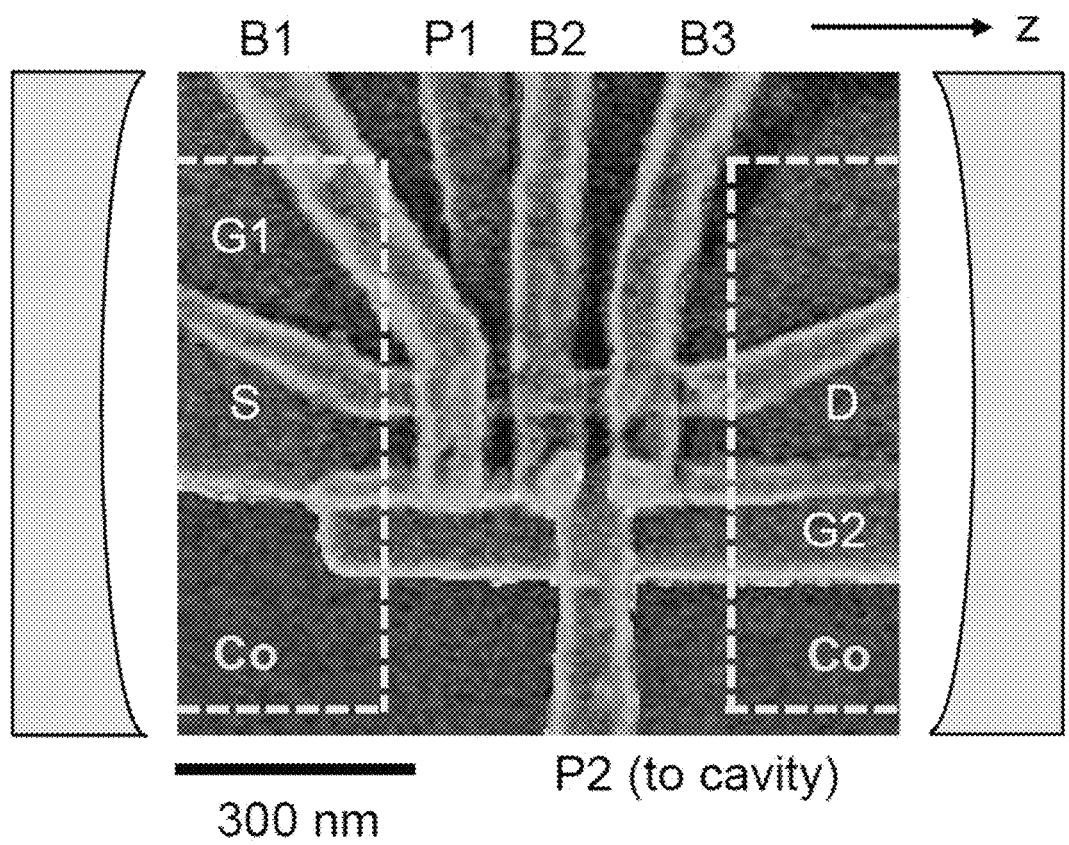
FIG. 2A shows an image of an example fabricated device.

The one or more conducting layers may comprise a second conducting layer. The first conducting layer may be disposed on (e.g., or partially on, above) the second conducting layer. The second conducting layer may comprise one or more plunger gates 114 configured to cause an electron to move between the at least two quantum states. The electron may be caused to move from one quantum state to another quantum state based on applying a positive voltage to one of the one or more plunger gates 114 and/or apply a negative voltage to another of the one or more plunger gates 114. The second conducting layer may comprise a source 116 and a drain 118. The source 116 and/or the drain 118 may be configured to provide the electron for isolation in the at least two quantum states. It should be understood that additional conducting layers may be used, even if not shown in FIG. 1. For example, additional conducting layers may comprise a screening layer (e.g., a screening gate layer), a split-gate layer (e.g., as shown in FIG. 2A), and/or the like. An example screening layer with plunger and barrier layers is disclosed in U.S. patent application Ser. No. 15/208,227, filed on Jul. 12, 2016, which is hereby incorporated by reference in its entirety.

The one or more conducting layers (e.g., such as one or more of the plunger gates 114) may be configured to cause an electron to move back and forth between the at least two quantum states. The electron may be caused to be moved back and forth between the at least two quantum states in the presence of the inhomogeneous magnetic field. The electron may be caused to be moved back and forth between the at least two quantum states based on an oscillating electrical signal supplied by the one or more conducting layers. The oscillating electrical signal may be supplied to the one or more conducting layers by a signal generator (e.g., external to a superconducting/microwave cavity comprising the structure 102). The oscillating electrical signal may comprise a microwave frequency electrical signal, a radio frequency electrical signal, or a combination thereof. A microwave frequency may be a frequency in a range of about 300 MHz to about 300 GHz. A radio frequency may be a frequency in a range of about 3 kHz to about 300 MHz. The oscillating electrical signal may be in a range of about 1 GHz to about 10 GHz. The oscillating electrical signal may be in a range of about 3 kHz to about 300 GHz. The oscillating electrical signal may comprise a low power electrical signal. The oscillating electrical signal may have a power of less than about 60 dBm. The oscillating electrical signal may be in a power range of about −100 to about −120 dBm.

The movement of the electron between the at least two quantum states may generate an oscillating magnetic field. The oscillating magnetic field may oscillate at a microwave frequency (e.g., based on the oscillating electrical field). The oscillating magnetic field may drive a change in a spin state of the electron. The oscillating magnetic field may drive a quantum transition between a spin-up state and spin-down state of the electron thereby implementing a qubit gate on a spin state of the electron.

The one or more conducting layers may be configured to cause the electron to move back and forth based on a microwave frequency burst, a square voltage pulse, or a combination thereof. The one or more conducting layers may be configured to cause the electron to move back and forth based on simultaneously applying a microwave frequency burst and square voltage pulse to a plunger gate of the one or more conducting layers. The microwave frequency burst, a square voltage pulse, or a combination thereof may cause driving a coherent spin rotation within a specific rotation angle defined by a value of detuning set by the square voltage pulse.

The one or more conducting layers may comprise a layer electrically coupled to a center pin of a cavity, such as a superconducting cavity. The layer coupled to the cavity may comprise the second conducting layer. A plunger gate of the one or more plunger gates 114 may be coupled to the cavity. The plunger gate may be coupled to a pin (e.g., center pin, wire, center wire) of the cavity. The one or more conducting layers may comprise a first plunger gate configured to apply the oscillating electrical signal to move the electron between the at least two quantum states. The one or more conducting layers may comprise a second plunger gate configured to electrically couple a charge of the electron to an electric field of a cavity for spin-state readout.

The layer electrically coupled to the resonator may comprise a third conducting layer. The third conducting layer may comprise a split-gate layer. The third conducting layer (e.g., split gate layer) may comprise a first gate (e.g., labeled as G1 in FIG. 2A) and a second gate (e.g., labeled as G2 in FIG. 2B) separated from the first gate by a gap. One or more of the first gate or the second gate may be coupled to the cavity. One of more of the first gate or the second gate may be coupled to the cavity via a pin (e.g., center pin, wire, center wire) of the resonator. One or more of a size or a location of the gap may increase (e.g., maximize, optimize) and/or may be selected to increase an electric field in a region of the at least two first quantum states. The gap may be below or above one or more of the one or more plunger gates or the one or more barrier gates.

The structure 102 may comprise at least one magnetic field source, such as a first magnetic field source 120 and a second magnetic field source 122. The at least magnetic field source may comprise one or more magnetic and/or one or more current carrying wires. An example magnetic material may comprise cobalt, iron, nickel, alloys thereof, a multiferroic material, or a combination thereof. Any other magnetic material may be used. The at least magnetic field source may provide an inhomogeneous magnetic field (e.g., a magnetic field gradient), and/or the like.

Further description and examples of the disclosed techniques are described in detail below in the following sections. It should be understood that any of the features of one section may be combined with any of the features of another section as an implementation of the disclosure.

Traditional approaches to controlling single spins in quantum dots require the generation of large electromagnetic fields to drive many Rabi oscillations within the spin coherence time. Demonstrated below is "flopping-mode" electric dipole spin resonance, where an electron may be electrically driven in a Si/SiGe double quantum dot in the presence of a large magnetic field gradient. At zero detuning, charge delocalization across the double quantum dot may enhance coupling to the drive field and enable low power electric dipole spin resonance. Through dispersive measurements of the single electron spin state, a nearly three order of magnitude improvement in driving efficiency using flopping-mode resonance is demonstrated, which should facilitate low power spin control in quantum dot arrays.

Recent advances in silicon spin qubits have bolstered their standing as a platform for scalable quantum information processing. As single-qubit gate fidelities exceed 99.9%, two-qubit gate fidelities improve, and the field accelerates towards large multi-qubit arrays, developing the tools necessary for efficient and scalable spin control is critical. While it is possible to implement single electron spin resonance in quantum dots (QDs) using ac magnetic fields, the requisite high drive powers and associated heat loads are technically challenging and place limitations on attainable Rabi frequencies. As spin systems are scaled beyond a few qubits, methods of spin control which minimize dissipation and reduce qubit crosstalk will be important for low temperature quantum information processing.

Electric dipole spin resonance (EDSR) is an alternative to conventional electron spin resonance. In EDSR, static gradient magnetic fields and oscillating electric fields are used to drive spin rotations. The origin of the effective magnetic field gradient varies across implementations: intrinsic spin-orbit coupling, hyperfine coupling, and g-factor modulation have been used to couple electric fields to spin states. The inhomogeneous magnetic field generated by a micromagnet has been used to create a synthetic spin-orbit field for EDSR, enabling high fidelity control. Conveniently, this magnetic field gradient gives rise to a spatially varying Zeeman splitting, enabling spins in neighboring QDs to be selectively addressed.

Disclosed herein is a novel mechanism for driving low-power, coherent spin rotations, which may be referred to as "flopping-mode EDSR". In conventional EDSR, the electric drive field couples to a charge trapped in a single quantum dot, leading to a relatively small electronic displacement. The disclosed techniques instead may drive single spin rotations in a DQD close to zero detuning, $\epsilon=0$, where the electric field can force the electron to flop back and forth between the left and right dots, thereby sampling a larger variation in transverse magnetic field. This configuration may be referred to as the "flopping-mode".

Neglecting spin, the Hamiltonian describing a single electron trapped in a DQD is given by $H_0=(\epsilon/2)\tau_z+t_c\tau_x$, where $t_c$ is the interdot tunnel coupling and $\tau_i$ are the Pauli operators in position (L, R) space. In the highly detuned regime of a DQD (with $|\epsilon| \gg t_c$), the electron is strongly localized in either the left $|L\rangle$ or right $|R\rangle$ dot, and the relevant orbital energy scale is $E_{orb} \approx$ 3-5 meV. In contrast, when $\epsilon=0$ the charge delocalizes across the DQD leading to the formation of bonding and antibonding states $|\mp\rangle = (|R\rangle \mp |L\rangle)/\sqrt{2}$. Here the bonding-antibonding energy difference $2t_c \approx$ 20-40 μeV is dominant and the charge is much more susceptible to oscillating electric drive fields.

The application of a magnetic field results in Zeeman splitting of the spin states. When the Zeeman energy and tunnel splitting $2t_c$ at $\epsilon=0$ are comparable, the combination of a magnetic field gradient and the large electric dipole moment result in strong spin-charge hybridization. This allows electric fields to couple to spin indirectly via the charge. A single-electron spin qubit may be coherently manipulated in the flopping-mode regime. The power required to drive Rabi oscillations is almost three orders of magnitude less than in single dot EDSR. In addition to improving the spin sensitivity to electric fields, there is a "sweet spot" at $\epsilon=0$ where charge noise is suppressed, leading to a four-fold improvement in qubit quality factor.

The example device comprises two single-electron natural-Si/SiGe DQDs (DQD1 and DQD2) that are embedded in a half-wavelength niobium superconducting cavity with resonance frequency $f_c=5.846$ GHz. A false-color scanning electron microscope (SEM) image of one of the DQDs is shown in FIG. 2A. For the purposes of this experiment, only one DQD is active at a time. Electronic confinement is achieved using an overlapping aluminum gate stack. For each DQD, the plunger gate P2 is connected to the center pin of the superconducting cavity, efficiently coupling the charge confined in the DQD to the electric field of the cavity.

Cobalt micromagnets (e.g., shown by dashed lines in FIG. 2A) generate a local magnetic field gradient with longitudinal and transverse components. The total magnetic field at the device $\vec{B}^{tot}$ is the sum of the external magnetic field $\vec{B}^{ext}$ applied in the z direction, and the stray field from the micromagnet $\vec{B}^M$. As a result, the total magnetic field $\vec{B}^{tot}$ is a sensitive function of position in the DQD confinement potential. The micromagnet enables EDSR and gives rise to spin-photon coupling, which is utilized here solely for dispersive cavity readout of the spin state.

Figure 2B:
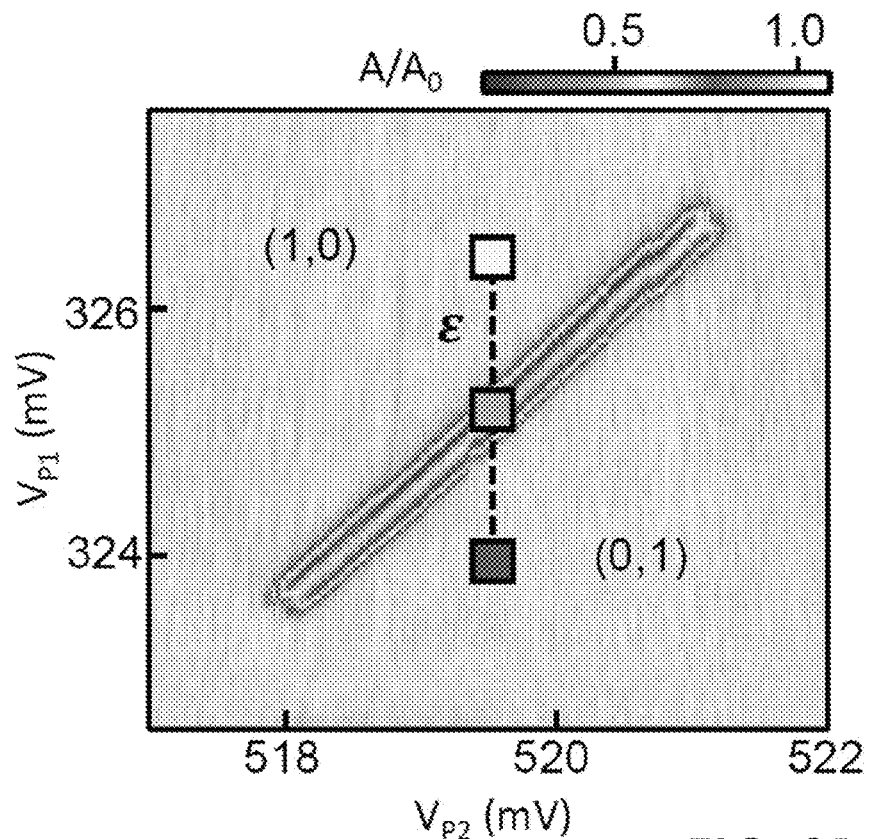
FIG. 2B shows normalized cavity transmission amplitude as a function of the gate voltages near an interdot charge transition for an example quantum dot.
Figure 2C:
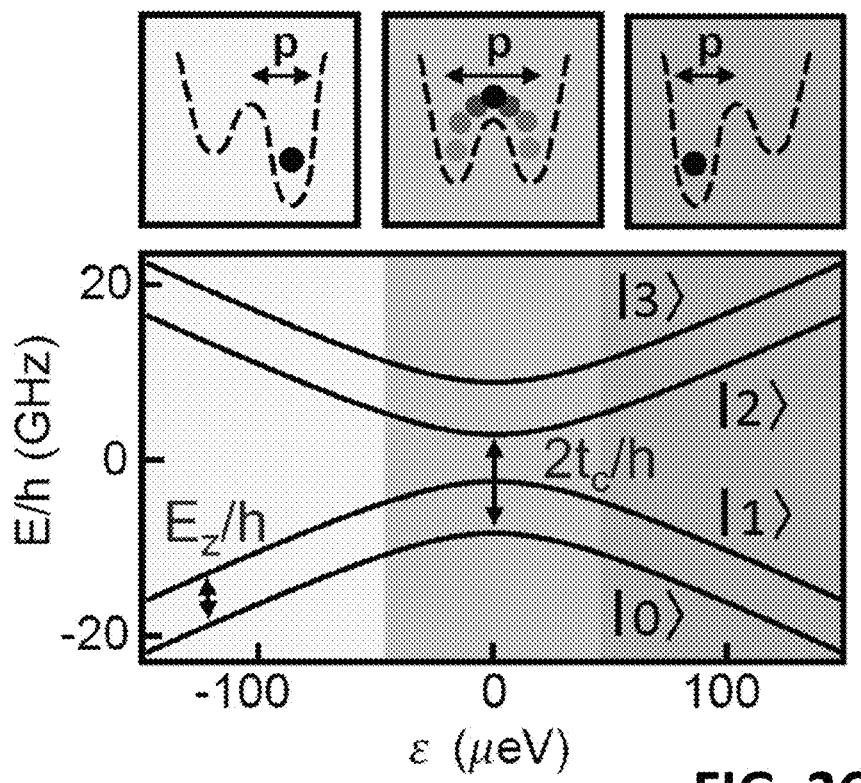
FIG. 2C shows a schematic and an energy diagram illustrating differences in electric dipole moment for different dot regimes.

FIG. 2A shows a false-color SEM image of the device. Gate P2 of the DQD is galvanically connected to the center pin of the superconducting cavity. FIG. 2B shows normalized cavity transmission amplitude $A/A_0$ as a function of the gate voltages $V_{P1}$ and $V_{P2}$ near the interdot charge transition for DQD2, with $2t_c/h=4.9$ GHz. The dashed arrow denotes the DQD detuning parameter $\epsilon$. FIG. 2C shows in the top panel a schematic comparison of the far detuned single dot regime ($|\epsilon| \gg 2t_c$) and flopping-mode regime ($\epsilon \approx 0$). Charge hybridization near $\epsilon=0$ results in a large electric dipole moment p compared to the single dot regime. FIG. 2C shows in the bottom panel an energy diagram calculated with $2t_c/h=11.1$ GHz, $B_z=209.4$ mT, $b_z=0$ mT and $b_x=15$ mT.

The charge degree of freedom with $B^{tot}=0$ is probed by measuring the cavity transmission amplitude $A/A_0$ in the single photon regime, as a function of the gate voltages $V_{P1}$ and $V_{P2}$, as shown in FIG. 2B. This data are acquired near the (1,0)–(0,1) interdot charge transition with the probe frequency equal to the cavity frequency $f=f_c$. Here $(n_L, n_L)$ denotes the charge occupancy of the DQD, where $n_L(n_R)$ is the number of electrons in the left(right) dot. Around $\epsilon=0$, where the DQD is maximally polarizable, electric fields from the cavity result in charge dynamics within the DQD that load the super-conducting cavity and reduce $A/A_0$. Neglecting spin, the energy difference between the bonding and the bonding charge states is $\Omega(\epsilon)=\sqrt{\epsilon^2+4t_c^2}$. In the case where $2t_c < hf_c$, there will be two values of detuning where $\Omega(\epsilon)=hf_c$ (h is Planck's constant). Around these values of detuning the cavity response is substantial, as is evident from the data in FIG. 2B. Since the flopping-mode EDSR mechanism is based on charge motion in a magnetic field gradient, it will also be most effective near $\epsilon=0$, where the charge dipole moment $\vec{p}$ is largest, as shown in FIG. 2C.

In the presence of a micromagnet and external magnetic field, the Hamiltonian describing the one-electron DQD is $$H_s = H_0 + \frac{1}{2}g\mu_B[B_z\sigma_z + (b_x\sigma_x + b_z\sigma_z)\tau_z],$$

where $\sigma_i$ are the Pauli operators in spin space, $B_z$ is the homogeneous magnetic field component in the z direction, I is the electronic I-factor, and $\mu_B$ is the Bohr magneton. In general, $\vec{B}^M$ will generate longitudinal $b_z$ and transverse ($b_x$, $b_y$) gradients that will modify the energy level spectrum. The parameter $2b_i$ (i=x, y, z) may be defined as the difference in total magnetic field between the left and right dots in the i direction. Without loss of generality, $b_y=0$ may be taken in the remainder of the disclosure. The total magnetic field components at the left and right dots can be written as $B_z^{tot}=B_z\pm b_z$ and $B_x^{tot}=B_x\pm b_x$, where $B_{z(x)}$ is the homogeneous magnetic field in the z(x) direction. For our micromagnet design, $B_x \approx 0$ may be expected, but note that in the case where $B_x \neq 0$, the geometric coordinate system can always be rotated to satisfy $B_x=0$. The Zeeman energy is given by $E_z=g\mu_B B_z$.

Zeeman splitting of the bonding/antibonding states leads to the 4-level system shown in FIG. 2C, where $|0(1)\rangle \equiv |-,\downarrow(\uparrow)\rangle$ refer to the spin-down and spin-up bonding states, and $|2(3)\rangle \equiv |+,\downarrow(\uparrow)\rangle$ to the spin-down and spin-up antibonding states. Spin-preserving interdot tunnel coupling $t_c$ results in the anticrossings near $\epsilon=0$. The $b_z$ component gives rise to a spatially varying longitudinal field such that the energy splitting $E_{01}$ between the ground $|0\rangle$ and first excited state $|1\rangle$ can vary significantly in the far detuned limits, e.g. $\epsilon \gg 0$ versus $\epsilon=0$. The transverse components of the micromagnet field hybridize the spin-orbital states near $\epsilon=0$ and lead to spin-photon coupling, which enables dispersive spin state readout.

Figure 3A:
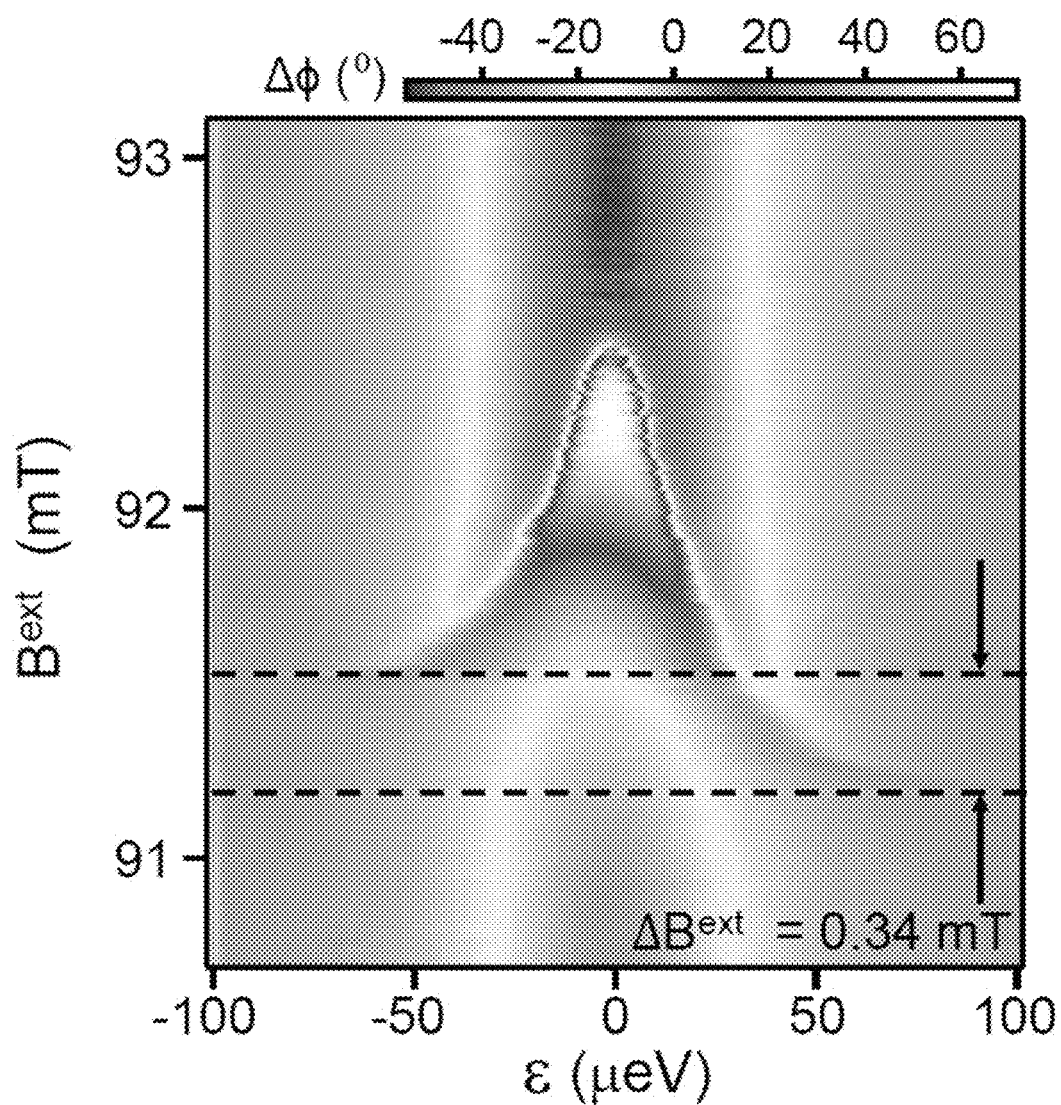
FIG. 3A shows a phase response of example cavity transmission as a function of the external magnetic field for an example quantum dot.
Figure 3B:
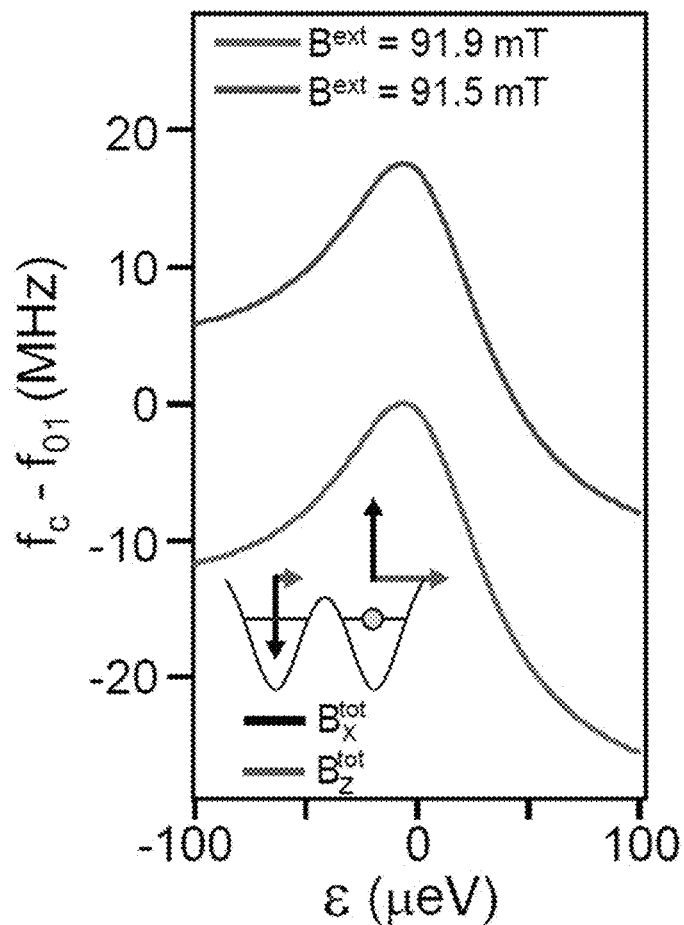
FIG. 3B shows a difference between the cavity frequency and spin transition frequency.
Figure 3C:
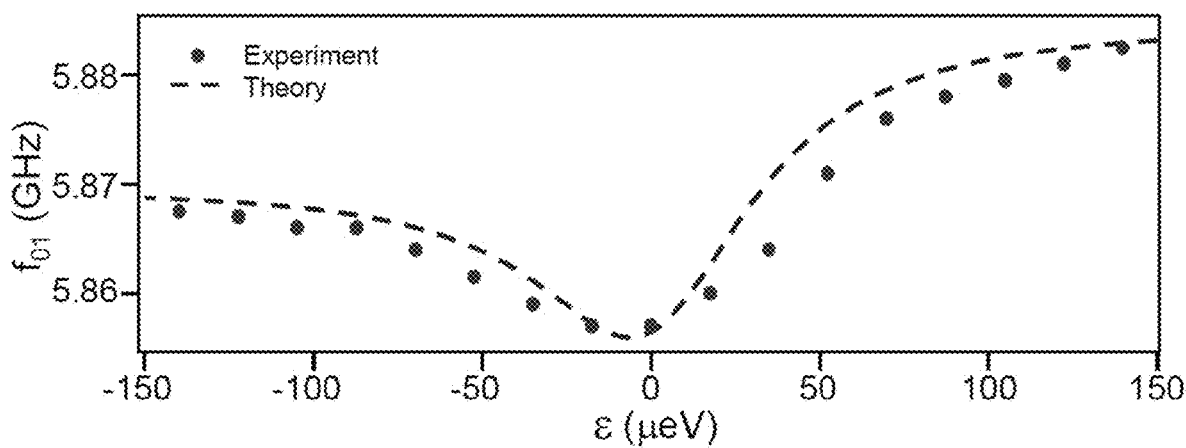
FIG. 3C shows a plot of spin transition frequency.

FIG. 3A shows a phase response of the cavity transmission $\Delta\phi$ as a function of $B^{ext}$ and $\epsilon$ for DQD1 with $2t_c/h=7.4$ GHz. Dashed lines show asymmetry in spin-cavity interactions at high and low detuning. The extracted $\Delta B^{ext}$ is used to determine $b_z$. FIG. 3B shows a difference between the cavity frequency $f_c$ and spin transition frequency $f_{01}$ as a function of $\epsilon$ for $B^{ext}=91.9$ mT (navy) and $B^{ext}=91.5$ mT (purple). The inset in FIG. 3B shows a drawing of a DQD in the presence of spatially varying $B_x^{tot}(B_z^{tot})$ fields, not drawn to scale. FIG. 3C shows $f_{01}$ as a function of $\epsilon$ for DQD1, with $2t_c/h=11.1$ GHz, as extracted from time-domain Rabi oscillations. The dashed line shows a fit to theory with $2t_c/h=11.1$ GHz, $B_z=209.4$ mT, $b_x=15$ mT and $b_z=0.27$ mT.

In general, the electron spin resonance condition will be a function of detuning owing to the magnetic field gradients. To investigate the flopping-mode EDSR mechanism, the spin resonance condition may be mapped out by measuring the cavity phase shift $\Delta\phi$ as a function of $B^{ext}$ and $\epsilon$, as shown in FIG. 3A. The funnel-shaped feature in FIG. 3A is a consequence of detuning-dependent charge hybridization and Zeeman physics in the regime where $E_{01} \ll 2 t_c$. At low $B^{ext}$, the spin transition is detuned from the cavity, but there is still a small phase response around $\epsilon=0$ due to the large electric dipole moment. At large detunings ($|\epsilon| \gg 2t_c$) the energy splitting $E_{01}$ is dominated by Zeeman physics. At small detunings, levels $|1\rangle$ and $|2\rangle$ hybridize due to transverse magnetic fields. This spin-charge hybridization pulls $E_{01}$ slightly below the Zeeman energy. As a result, when $E_{01}$ is slightly less than $hf_c$ at $\epsilon=0$, there are two values of finite detuning for which $E_{01}$ is on resonance with the cavity, giving rise to the wings of the funnel-shaped feature that begins at $B^{ext} \sim 91.2$ mT. As $B^{ext}$ increases further the values of detuning that lead to resonance with the cavity shift closer to $\epsilon=0$. Eventually, at $B^{ext} \sim 91.9$ mT, the two resonance conditions merge at $\epsilon=0$. FIG. 3B shows theoretical predictions for $f_c - f_{01}$ as a function of $\epsilon$ for $B^{ext}=91.5$ mT and 91.9 mT, with $f_{01} \equiv E_{01}/h$.

Figure 4A:
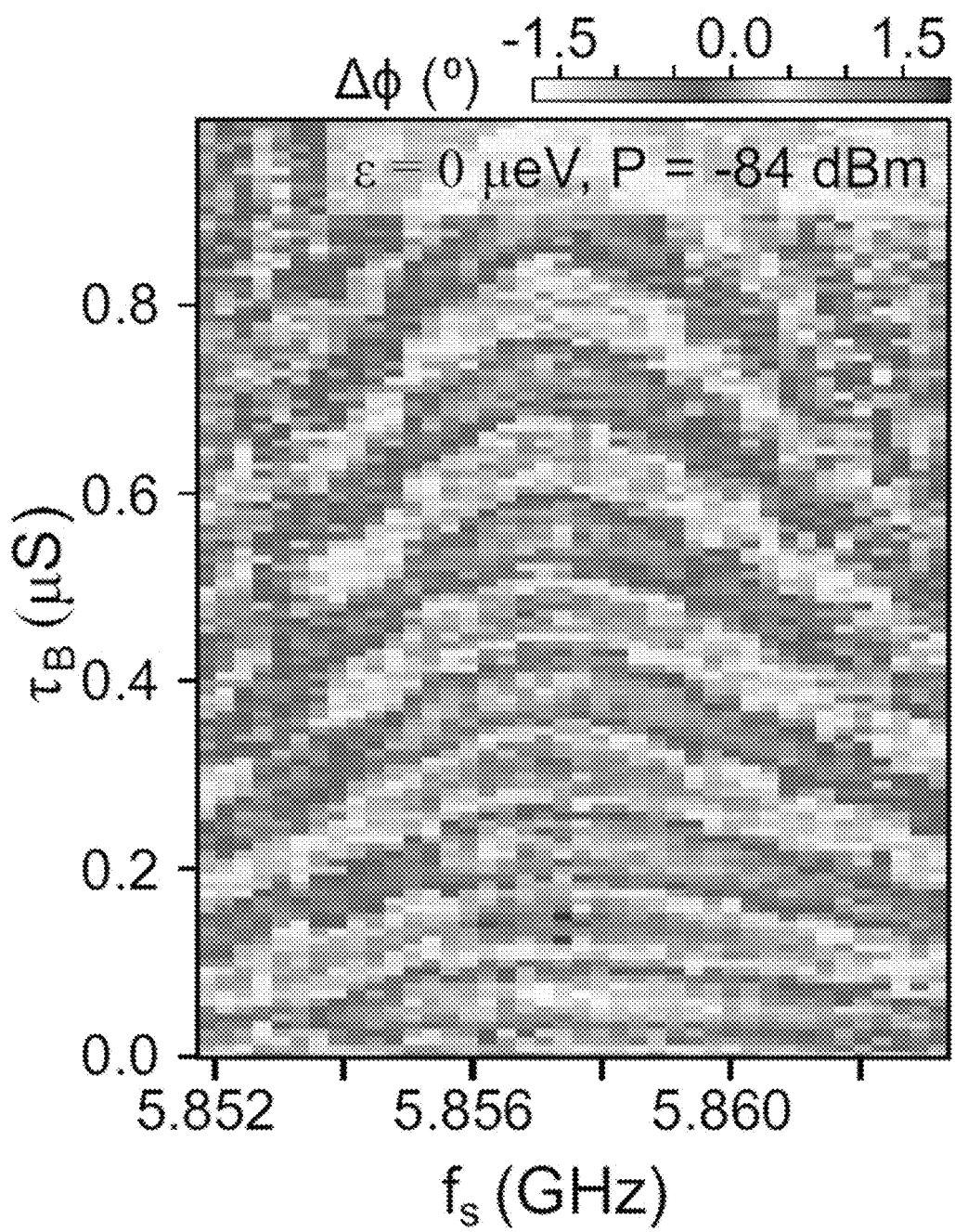
FIG. 4A shows an example Rabi chevron for an example device.
Figure 4B:
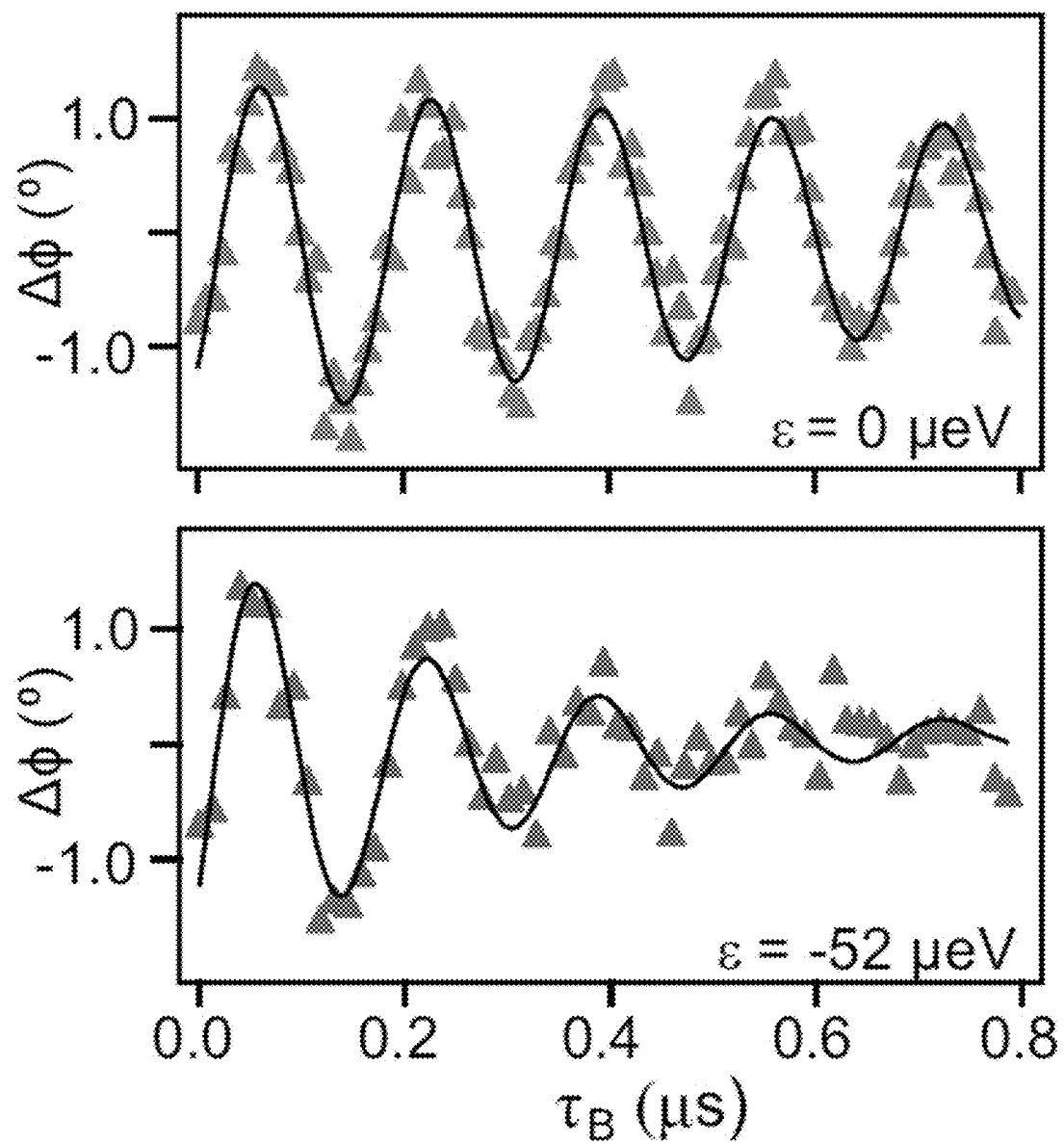
FIG. 4B shows example Rabi oscillations for an example device.

FIG. 4A shows a Rabi chevron acquired at $\epsilon=0$, $2t_c/h=11.1$ GHz, and with gate P1 driven at frequency $f_s$ for a time $\tau_B$. The cavity phase response $\Delta\phi$ is measured for 20 μs after each Rabi burst. Data are acquired with a total per point integration time of 100 ms. FIG. 4B shows Rabi oscillations acquired with $\epsilon=0$ (upper panel, $P_s=-84$ dBm) and $\epsilon=-52$ μeV (lower panel, $P_s=-77$ dBm). The data are fit to an exponentially decaying sinusoid (solid black line). All data are acquired from DQD1.

With the electron spin resonance frequency $f_{01}$ now mapped out as a function of $B^{ext}$ and $\epsilon$, coherent single spin rotations can be driven using flopping-mode EDSR. At $\epsilon=0$, a microwave burst of frequency $f_s$ and duration $\tau_B$ is applied to gate P1 to drive coherent spin rotations. The final spin state is read out dispersively at $\epsilon=0$ by measuring the cavity phase response $\Delta\phi$.

A typical flopping-mode dataset is shown in FIG. 4A, where $\Delta\phi$ is plotted as a function of $f_s$ and $\tau_B$. As expected, the Rabi oscillation visibility is maximal when $f_s$ is resonant with $f_{01}$. The spin transition frequency $f_{01}$ is plotted in FIG. 3C as a function of $\epsilon$. When $2t_c \gg E_z$, the lowest $f_{01}$ occurs near $\epsilon=0$ due to spin-charge hybridization, and $f_{01}$ increases as $|\epsilon|$ increases. The trends in these data are in general agreement with the data measured using microwave spectroscopy in FIG. 3A. The asymmetry of the data in FIGS. 3A and 3C about $\epsilon=0$ is due to the longitudinal gradient field $b_z$.

Using the expressions $2b_z=(1+\chi)\Delta B^{ext}$, where $\chi$ is the micromagnet magnetic susceptibility and $\Delta B^{ext}=0.34$ mT (e.g., from data in FIG. 3A), we find $b_z=0.27$ mT. This value is taken and fit the data in FIG. 3C, finding good agreement between experiment and our theoretical model.

Having gained a quantitative understanding of how $f_{01}$ depends on $\epsilon$, we now compare EDSR in the flopping-mode and single dot regimes. By simultaneously applying a microwave burst and square pulse to gate P1, drive coherent spin rotations can be driven at a value of detuning set by the amplitude of the square pulse. Due to the ratio of electric dipole moments in these regimes, the power P required to drive fast coherent rotations in the single dot regime is expected to be much higher. As shown in the upper panel of FIG. 4B, at $\epsilon=0$ a Rabi frequency $f_{Rabi}=6$ MHz is achieved with P=−84 dBm at the device. In contrast, when $\epsilon=-52$ μeV a power of P=−77 dBm is required to achieve approximately the same Rabi frequency (e.g., as shown in FIG. 4B, lower panel). The actual power at the gate is determined by measuring the envelope of Landau-Zener-Stueckelberg interference fringes as a function of increasing P. The Rabi oscillations are fit to an exponentially decaying sinusoid with $T_2^{Rabi}=1.4$ μs at $\epsilon=0$ μeV and $T_2^{Rabi}=0.24$ μs at $\epsilon=-52$ μeV.

Figure 5A:
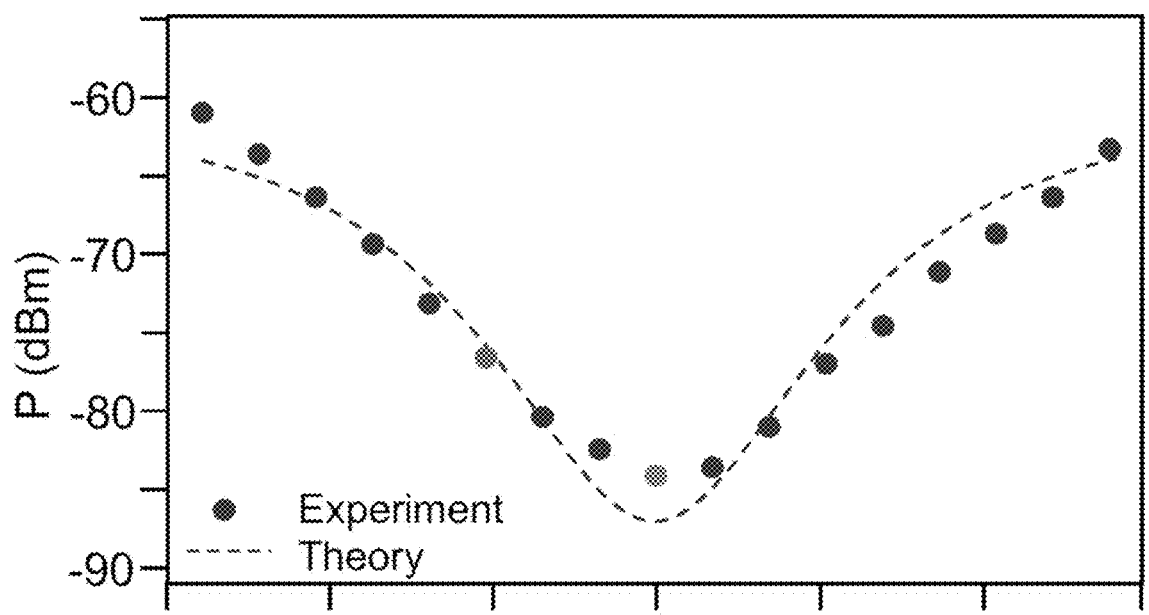
FIG. 5A shows on-chip power required to drive example Rabi oscillations.
Figure 5B:
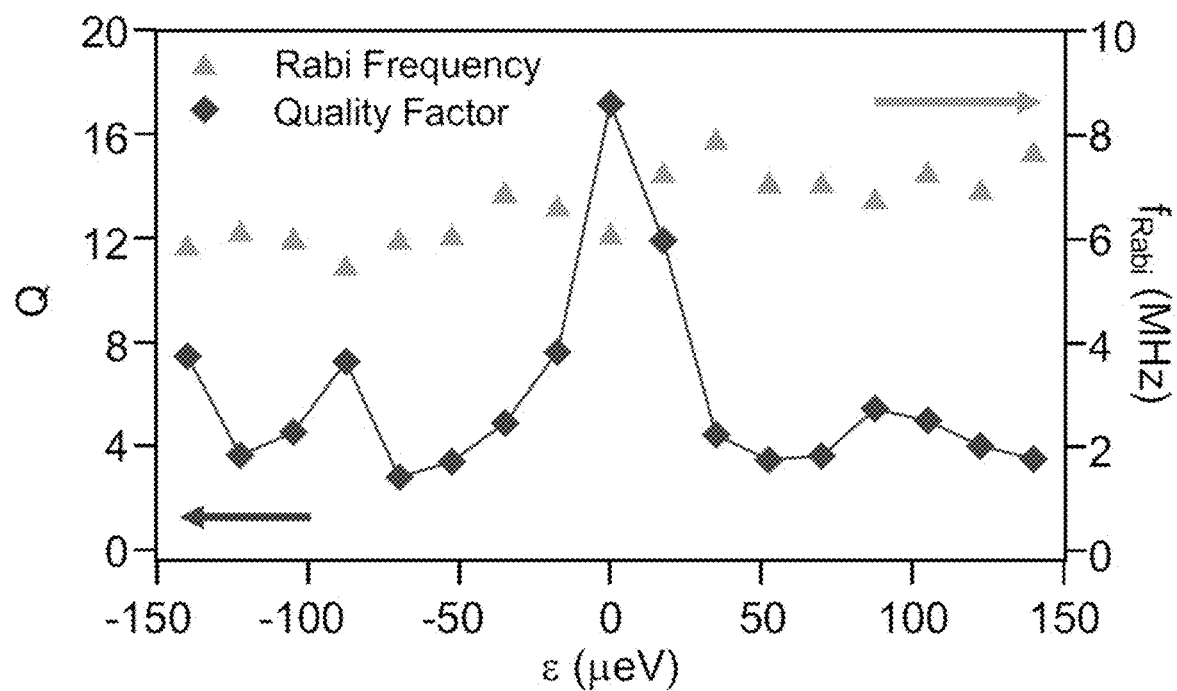
FIG. 5B shows a quality factor of Rabi oscillations and Rabi frequency.

FIG. 5A shows on-chip power P required to drive ≈6 MHz Rabi oscillations as a function of , with $2t_c/h=11.1$ GHz. Green (light blue) data points at $\epsilon=0$ ($\epsilon=-52$ μeV) are taken from the same dataset as the top (bottom) panel in FIG. 4B. FIG. 5B shows a quality factor Q of Rabi oscillations and Rabi frequency $f_{Rabi}$ plotted as a function of $\epsilon$. There is a significant improvement in Q around $\epsilon=0$.

The full crossover from the single dot to the flopping-mode regime is examined over a 300 μeV range of de-tuning in FIG. 5A. Here, the power required to achieve ≈6 MHz Rabi oscillations is plotted as a function of $\epsilon$. The data are nearly symmetric about $\epsilon=0$, as expected from the detuning symmetry of the energy levels. Most importantly, these data show that ~250× less microwave power is required to achieve a $f_{Rabi}\approx6-8$ MHz at $\epsilon=0$ compared to the standard single dot EDSR regime.

From theory, the drive power required to drive Rabi oscillations at frequency $f_{Rabi}$ is given by $$P \propto f_{Rabi}^2 \left(\frac{4t_c^2}{\Omega} \frac{g\mu_B b_x}{(\Omega^2 - E_x^2)} + \beta\right)^{-2}$$

where $\beta=0.003$ is a fitting parameter that accounts for single dot EDSR in the far-detuned limits ($|\epsilon|\gg 2t_c$). The data in FIG. 5A is fit to Eq. (2), obtaining close agreement between theory and experiment.

A charge noise sweet spot exists when $\partial E_{01}/\partial\epsilon=0$. In the absence of a longitudinal ($b_z$) gradient the sweet spot occurs at $\epsilon=0$. Theory predicts that a $b_z$ gradient may shift the sweet spot to finite detuning, or if the gradient field is large enough, destroy it entirely. Evidence of a sweet spot is searched for by examining the quality factor of π-rotations $Q\equiv 2T_2^{Rabi}$ as a function of detuning. At each value of detuning, a Rabi chevron is acquired with P set to achieve $f_{Rabi}\approx 6$ MHz, similar to FIG. 4A. A Fourier transform is taken of each column of the chevron and identify $f_{01}$. At this $f_{01}$, the Rabi oscillations are fit as a function of $\tau_B$ to extract $T_2^{Rabi}$ and $f_{Rabi}$.

The Rabi frequency and Q-factor are plotted as a function of $\epsilon$ in FIG. 5B. At finite detuning $Q\approx4$. More than a four-fold increase in the quality factor is observed, with Q=18 at $\epsilon=0$. The enhancement of Q in the flopping-mode regime can be attributed to the presence of the charge noise sweet spot, which to first order decouples the spin from electrical detuning noise. While the Q factors achieved here are lower than those reported elsewhere, it is expected that optimizing $t_c$ and fabricating devices on enriched $^{28}$Si quantum wells will further improve Q.

In summary, an efficient flopping-mode mechanism for EDSR in semiconductor DQDs is demonstrated. Compared to single dot EDSR, flopping-mode EDSR requires nearly three orders of magnitude less power, rendering it a valuable control technique for future spin-based quantum processors. Conveniently, the flopping-mode regime of maximal power efficiency coincides with a charge noise sweet spot, yielding a four-fold improvement in qubit quality factor. While the device studied here is embedded in a microwave cavity for readout purposes, it should be understood that flopping-mode EDSR could be implemented in DQDs that are read out using conventional spin-to-charge conversion or Pauli blockade. It is anticipated that flopping-mode spin resonance will enable power-efficient single qubit control in large-scale silicon quantum processors.

It is to be understood that the methods and systems are not limited to specific methods, specific components, or to particular implementations. It is also to be understood that the terminology used herein is for the purpose of describing particular embodiments only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

As used herein, the terms "about" and "at or about" mean that the amount or value in question can be the designated value, approximately the designated value, or about the same as the designated value. It is generally understood, as used herein, that it is the nominal value indicated ±10% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where "about" is used before a quantitative value, the parameter also includes the specific quantitative value itself, unless specifically stated otherwise.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Components are described that may be used to perform the described methods and systems. When combinations, subsets, interactions, groups, etc., of these components are described, it is understood that while specific references to each of the various individual and collective combinations and permutations of these may not be explicitly described, each is specifically contemplated and described herein, for all methods and systems. This applies to all aspects of this application including, but not limited to, operations in described methods. Thus, if there are a variety of additional operations that may be performed it is understood that each of these additional operations may be performed with any specific embodiment or combination of embodiments of the described methods.

The various features and processes described above may be used independently of one another, or may be combined in various ways. All possible combinations and sub-combinations are intended to fall within the scope of this disclosure. In addition, certain methods or process blocks may be omitted in some implementations. The methods and processes described herein are also not limited to any particular sequence, and the blocks or states relating thereto may be performed in other sequences that are appropriate. For example, described blocks or states may be performed in an order other than that specifically described, or multiple blocks or states may be combined in a single block or state. The example blocks or states may be performed in serial, in parallel, or in some other manner. Blocks or states may be added to or removed from the described example embodiments. The example systems and components described herein may be configured differently than described. For example, elements may be added to, removed from, or rearranged compared to the described example embodiments.

While the methods and systems have been described in connection with preferred embodiments and specific examples, it is not intended that the scope be limited to the particular embodiments set forth, as the embodiments herein are intended in all respects to be illustrative rather than restrictive.

It will be apparent to those skilled in the art that various modifications and variations may be made without departing from the scope or spirit of the present disclosure. Other embodiments will be apparent to those skilled in the art from consideration of the specification and practices described herein. It is intended that the specification and example figures be considered as exemplary only, with a true scope and spirit being indicated by the following claims.

What is claimed:

1. A nanoscale semiconductor quantum device, comprising:
    at least one magnetic field source configured to supply an inhomogeneous magnetic field;
    at least one semiconducting layer; and
    one or more conducting layers comprising a source and a drain and configured to:
        define at least two quantum states in the at least one semiconducting layer; and
        cause, based on an oscillating electrical signal supplied by the one or more conducting layers, an electron to move back and forth between the at least two quantum states in the presence of the inhomogeneous magnetic field, wherein the movement of the electron between the at least two quantum states generates an oscillating magnetic field to drive a quantum transition between a spin-up state and spin-down state of the electron thereby implementing a qubit gate on a spin state of the electron,
    wherein the at least one magnetic field source is located in a first layer of a material stack of the device and the one or more conducting layers are located in a second layer, of the material stack, different from the first layer.

2. The device of claim 1, wherein the at least two quantum states comprise a gate defined silicon double quantum dot, and wherein the oscillating electrical signal has one or more of a microwave frequency, a radio frequency, or a frequency in a range of about 3 kHz to about 300 GHz.

3. The device of claim 1, wherein the at least one magnetic field source comprises at least one micro-magnet that is electrically isolated from the at least one semiconducting layer and the one or more conducting layers.

4. The device of claim 1, wherein the one or more conducting layers comprise a first conducting layer comprising one or more barrier gates configured to define the at least two quantum states, and wherein the one or more conducting layers comprise a second conducting layer comprising one or more plunger gates configured to cause the electron to move between the at least two quantum states.

5. The device of claim 1, wherein the one or more conducting layers comprise a first plunger gate configured to apply the oscillating electrical signal to move the electron between the at least two quantum states and a second plunger gate configured to electrically couple a charge of the electron to an electric field of a cavity for spin-state readout.

6. The device of claim 1, wherein the one or more conducting layers are configured to cause the electron to move back and forth based on simultaneously applying a microwave frequency burst and a square voltage pulse to a plunger gate of the one or more conducting layers thereby driving a coherent spin rotation within a specific rotation angle defined by a value of detuning set by the square voltage pulse.

7. The device of claim 1, wherein the at least two quantum states are biased to within a few micro-electron volts of zero detuning such that the at least two quantum states are on resonance.

8. The device of claim 1, wherein the inhomogeneous magnetic field extends into a portion of the at least one semiconducting layer in which the electron moves back and forth between the at least two quantum states.

9. The device of claim 1, wherein the at least one magnetic field source causes a magnetic field gradient sufficiently large to cause a change in the magnetic field, in a range of about 1 mT to about 1000 mT, as the electron moves between the at least two quantum states.

10. A system for operating a nanoscale semiconductor quantum device, the system comprising:
    a signal generator configured to generate an oscillating electrical signal; and
    a structure disposed in a cavity, the structure comprising:
        at least one magnetic field source configured to supply an inhomogeneous magnetic field;
        at least one semiconducting layer; and
        one or more conducting layers comprising a source and a drain and configured to:
            define at least two quantum states in the at least one semiconducting layer; and cause, based on the oscillating electrical signal generated by the signal generator and supplied by the one or more conducting layers, an electron to move back and forth between the at least two quantum states in the presence of the inhomogeneous magnetic field, wherein the movement of the electron between the at least two quantum states generates an oscillating magnetic field to drive a quantum transition between a spin-up state and spin-down state of the electron thereby implementing a qubit gate on a spin state of the electron, wherein the at least one magnetic field source is located in a first layer of a material stack of the structure and the one or more conducting layers are located in a second layer, of the material stack, different from the first layer.

11. The system of claim 10, wherein the at least two quantum states comprise a gate defined silicon double quantum dot, and wherein the oscillating electrical signal has one or more of a microwave frequency, a radio frequency, or a frequency in a range of about 3 kHz to about 300 GHz.

12. The system of claim 10, wherein the at least one magnetic field source comprises at least one micro-magnet that is electrically isolated from the at least one semiconducting layer and the one or more conducting layers.

13. The system of claim 10, wherein the one or more conducting layers comprise a first conducting layer comprising one or more barrier gates configured to define the at least two quantum states, and wherein the one or more conducting layers comprise a second conducting layer comprising one or more plunger gates configured to cause the electron to move between the at least two quantum states.

14. The system of claim 10, wherein the one or more conducting layers comprise a first plunger gate configured to apply the oscillating electrical signal and a second plunger gate configured to electrically couple a charge of the electron to an electric field of the cavity.

15. The system of claim 10, wherein the one or more conducting layers are configured to cause the electron to move back and forth based on simultaneously applying a microwave frequency burst and a square voltage pulse, generated by the signal generator, to a plunger gate of the one or more conducting layers thereby driving a coherent spin rotation within a specific rotation angle defined by a value of detuning set by the square voltage pulse.

* * * * *